United States Patent
Kim et al.

(10) Patent No.: US 7,364,992 B2
(45) Date of Patent: Apr. 29, 2008

(54) METHOD OF FORMING POLYCRYSTALLINE SILICON THIN FILM AND METHOD OF MANUFACTURING THIN FILM TRANSISTOR USING THE METHOD

(75) Inventors: Dong-byum Kim, Seoul (KR); Se-jin Chung, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 11/506,723

(22) Filed: Aug. 18, 2006

(65) Prior Publication Data

US 2007/0054477 A1     Mar. 8, 2007

(30) Foreign Application Priority Data

Aug. 19, 2005  (KR)  ............. 10-2005-0076347

(51) Int. Cl.
*H01L 21/20* (2006.01)
(52) U.S. Cl. ............................... 438/487; 257/E21.134
(58) Field of Classification Search ................ 438/487; 257/E21.134
See application file for complete search history.

(56) References Cited

U.S. PATENT DOCUMENTS

| 6,117,752 | A  | * | 9/2000  | Suzuki ........................ 438/487 |
| 6,746,942 | B2 | * | 6/2004  | Sato et al. ................... 438/586 |
| 2004/0209447 | A1 | * | 10/2004 | Gosain et al. ............... 438/486 |
| 2006/0102901 | A1 | * | 5/2006  | Im et al. ....................... 257/64 |

FOREIGN PATENT DOCUMENTS

| JP | 2003-151904 | 5/2003 |
| JP | 2004-193263 | 7/2004 |
| KR | 10-0478757  | 3/2005 |

OTHER PUBLICATIONS

Patent Abstracts of Japan, Publication No. 2003-151904, May 23, 2003, 1 p.
Patent Abstracts of Japan, Publication No. 2004-193263, Jul. 8, 2004, 1 p.
Korean Patent Abstracts, Registration No. 10-0478757, Mar. 16, 2005, 1 p.

* cited by examiner

*Primary Examiner*—Matthew S. Smith
*Assistant Examiner*—Walter Swanson
(74) *Attorney, Agent, or Firm*—MacPherson Kwok Chen & Heid LLP; Jeffrey S. Scheonwald

(57) ABSTRACT

A method of forming a polycrystalline silicon thin film with improved electrical characteristics and a method of manufacturing a thin film transistor using the method of forming the polycrystalline silicon thin film. The method includes forming an amorphous silicon thin film on a substrate, partially melting a portion of the amorphous silicon thin film by irradiating the portion of the amorphous silicon thin film with a laser beam having a low energy density, forming polycrystalline silicon grains with a predetermined crystalline arrangement by crystallizing the partially molten portion of the amorphous silicon thin film, completely melting a portion of the polycrystalline silicon grains and a portion of the amorphous silicon thin film by irradiation of a laser beam having a high energy density while repeatedly moving the substrate by a predetermined distance, and growing the polycrystalline silicon grains by crystallizing the completely molten silicon homogeneously with the predetermined crystalline arrangement.

24 Claims, 8 Drawing Sheets

METHOD OF FORMING POLYCRYSTALLINE SILICON THIN FILM AND METHOD OF MANUFACTURING THIN FILM TRANSISTOR USING THE METHOD

This application claims priority from Korean Patent Application No. 10-2005-0076347 filed on Aug. 19, 2005 in the Korean Intellectual Property Office, the disclosure of which is incorporated herein by reference in its entirety.

BACKGROUND OF THE INVENTION

1. Field of the Invention

The present invention relates to a method of forming a polycrystalline silicon thin film with improved electrical characteristics and a method of manufacturing a thin film transistor using the method.

2. Description of the Related Art

A general liquid crystal display uses an amorphous silicon thin film transistor (a-Si TFT) as a switching element. In recent years, with the demand for high-definition display quality LCDs, a polycrystalline silicon thin film transistor (poly-Si TFT) having a high driving speed is widely used.

In the poly-Si TFT, various methods for forming the poly-Si thin film are well known. Of the different types of methods for forming poly-Si, the poly-Si thin film may be formed directly on a substrate made of, for example, glass. Second, the poly-Si thin film may be formed by forming an amorphous-Si (a-Si) thin film and then annealing the same.

In general, a glass substrate used in an LCD may deform during a general annealing treatment process performed at about 600° C. Thus, an excimer laser annealing (ELA) process has been suggested in order to anneal the a-Si thin film. According to the ELA process, laser beams having high energy are irradiated on the a-Si thin film. That is, the a-Si thin film is instantaneously melted for several nanoseconds (ns) and recrystallized without causing damages to the glass substrate.

In addition, the ELA process provides a Si thin film having a relatively high electric mobility such that Si atoms are rearranged in grains having high crystallinity when the a-Si thin film is melted in a liquid phase and then solidified.

In amorphous silicon thin film transistors (a-Si TFTs) used as switching devices of conventional liquid crystal displays (LCDs), an amorphous silicon thin film is crystallized into a polycrystalline silicon thin film by conventional excimer laser annealing. However, the polycrystalline silicon thin film is composed of grains with all crystalline plane orientations, i.e., with no regularity of crystalline plane orientations.

Generally, it is known that the {110} or {111} crystalline plane of polycrystalline silicon exhibits electrical mobility of about 300-400 $cm^2/V \cdot s$, whereas the {100} crystalline plane of polycrystalline silicon exhibits electrical mobility of about 600 $cm^2/V \cdot s$. For example, when a polycrystalline silicon thin film has grains predominantly oriented in the {100} crystalline plane direction, electrical mobility can be enhanced by about 1.5-2 times.

Thus, in order to enhance electrical characteristics of a polycrystalline silicon thin film transistor, it is necessary to form grains with selectively specific crystalline plane orientation.

SUMMARY OF THE INVENTION

The present invention provides a method of forming a polycrystalline silicon thin film with improved electrical characteristics.

The present invention also provides a method of manufacturing a thin film transistor using the method of forming the polycrystalline silicon thin film.

The above stated features and advantages, of the present invention will become clear to those skilled in the art upon review of the following description.

According to an aspect of the present invention, there is provided a method of forming a polycrystalline silicon thin film. The method comprises forming an amorphous silicon thin film; partially melting in a region a portion of the amorphous silicon thin film by irradiating the region of the amorphous silicon thin film with a laser beam having a first energy density whereby polycrystalline silicon grains with a predetermined crystalline arrangement are formed in the region of partially molten amorphous silicon thin film; and completely melting a portion of the polycrystalline silicon grains within the region and a portion of the amorphous silicon thin film adjacent to the region by irradiation of a laser beam having a second energy density greater than the first energy density.

According to another aspect of the present invention, there is provided a method of manufacturing a thin film transistor. The method comprises forming an amorphous silicon thin film on a substrate; forming a polycrystalline silicon thin film by irradiating the amorphous silicon thin film with a laser beam; forming a polycrystalline silicon pattern by patterning the polycrystalline silicon thin film; forming an insulating film on the polycrystalline silicon pattern; forming a gate electrode on the insulating film; and forming a source electrode and a drain electrode on portions of the polycrystalline silicon pattern separated from each other, and electrically connected to the portions of the polycrystalline pattern, wherein the forming of the polycrystalline silicon thin film comprises: forming an amorphous silicon thin film; partially melting in a region a portion of the amorphous silicon thin film by irradiating the region of the amorphous silicon thin film with a laser beam having a first energy density whereby polycrystalline silicon grains with a predetermined crystalline arrangement are formed in the region of partially molten amorphous silicon thin film; completely melting a portion of the polycrystalline silicon grains within the region and a portion of the amorphous silicon thin film adjacent to the region by irradiation of a laser beam having a second energy density greater than the first energy density.

BRIEF DESCRIPTION OF THE DRAWINGS

The above and other features and advantages of the present invention will become more apparent in light of the detailed description below of the exemplary embodiments thereof with reference to the attached drawings in which.

DETAILED DESCRIPTION OF THE INVENTION

Figure 1:
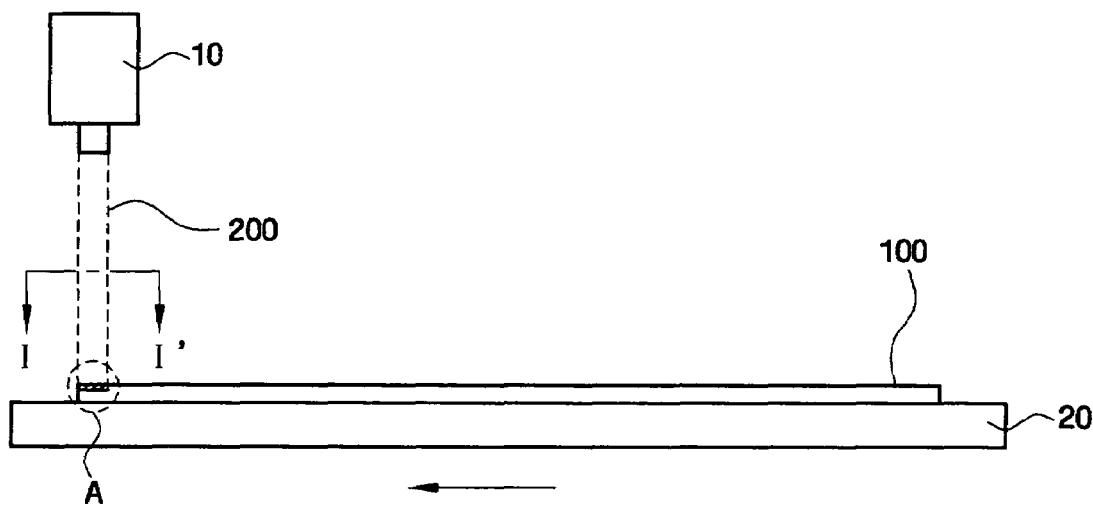
FIG. 1 is a side view illustrating an apparatus used in a method of forming a polycrystalline silicon thin film according to an embodiment of the present invention.

The present invention is described below more fully with reference to the accompanying drawings, in which preferred embodiments of this invention are shown. Advantages and features of the present invention and methods of accomplishing the same may be understood more readily by reference to the following detailed description of preferred embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. Like reference numerals refer to like elements throughout the specification.

Figure 2:
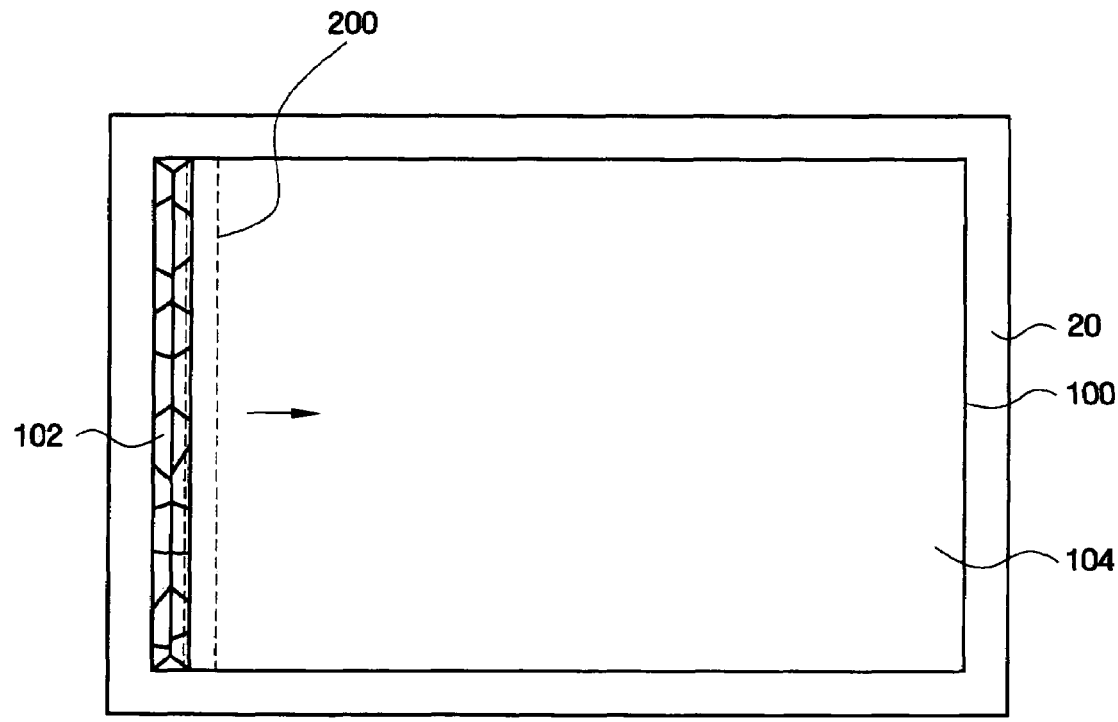
FIG. 2 is a plan view illustrating a method of forming a polycrystalline silicon thin film according to an embodiment of the present invention.

FIG. 1 is a side view illustrating an apparatus used in a method of forming a polycrystalline silicon thin film according to an embodiment of the present invention. FIG. 2 is a plan view illustrating a method of forming a polycrystalline silicon thin film according to an embodiment of the present invention, and FIG. 3 is an enlarged sectional view of a portion "A" of FIG. 1.

Figure 3:
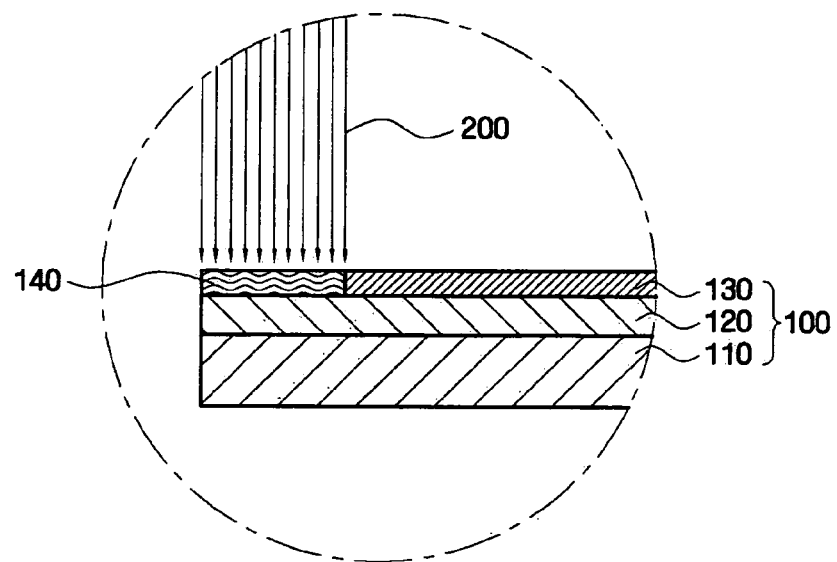
FIG. 3 is an enlarged sectional view of part A of FIG. 1.

Referring to FIGS. 1 through 3, an apparatus for forming a polycrystalline silicon thin film 140 includes a laser 10, an XY-stage 20, and a substrate 100.

Here, the laser 10 generates intermittently a laser beam 200 which is radiated onto the substrate 100. Preferably, the laser 10 is an excimer laser generating a short wavelength, high power, and high efficiency laser beam. The excimer laser may include, for example, an inert gas, a halide of the inert gas, mercury halide, an acidic compound of inert gas, a multi-element excimer, or the like. Examples of the inert gas include $Ar_2$, $Kr_2$, and $Xe_2$. Examples of the halide of the inert gas include ArF, ArCl, KrF, KrCl, XeF, and XeCl. Examples of the mercury halide include HgCl, HgBr, and HgI. Examples of the acidic compound of inert gas include ArO, KrO, and XeO. Examples of the multi-element excimer include $Kr_2F$, and $Xe_2F$.

The laser beam generated from the excimer laser has a wavelength of 200 to 400 nm, and preferably, 250 nm or 308 nm. That is to say, since the solid phase a-Si thin film 132 serves as a nucleus for growth of grains of poly-Si thin film 142, the poly-Si thin film 142 grows laterally from either side thereof by half a width of the laser beam 200. Here, the poly-Si thin film 142 grows laterally as long as 1 µm to 10 µm, typically 2 µm to 4 µm.

Here, the laser beam 200 is of pulse form. The pulse width is in a range from 20 to 300 nanoseconds (ns), and preferably, about 240 ns. The frequency of the laser beam 200 is in a range from 300 to 6,000 Hz, and preferably, from 4,000 to 6,000 Hz.

In addition, the laser 10 may be a solid-state laser capable of producing a high-power, pulsed laser beam from a miniature apparatus in a short time. The solid laser is exemplified by a ruby laser having a wavelength of 694.3 nm, an Nd: YAG laser having a wavelength of 1064 nm, an Nd: glass laser having a wavelength of 1064 nm, and so on. For convenience of illustration, the present invention will be described hereinafter with respect to excimer laser.

The XY-stage 20 supports the substrate 100, and gradually moves the substrate 100 by a predetermined distance. For example, the XY-stage 20 gradually moves the substrate 100 by a predetermined distance from right to left.

Whenever the substrate 100 is gradually moved by the XY-stage 20, the laser beam 200 generated from the laser 10 is radiated onto the substrate 100 while it is relatively gradually moved from a first end 102 of the substrate 100 to a second end 104 of the substrate 100. Here, the first end 102 of the substrate 100 refers to the left side of the substrate 100, and the second end 104 of the substrate 100 refers to the right side of the substrate 100. On the contrary, the XY-stage 20 may also gradually move the substrate 100 by a predetermined distance from left to right.

The substrate 100 is disposed on the XY-stage 20, and includes a transparent substrate 110, an oxide layer 120, and an amorphous silicon thin film 130. The size of the substrate 100 may be varied according to the purpose of use.

The transparent substrate 110 is disposed on the XY-stage 20, and is made of glass or quartz to allow light to pass therethrough. The oxide layer 120 is disposed on the transparent substrate 110 to improve interface characteristics between the transparent substrate 110 and the amorphous silicon thin film 130. The a-Si thin film 130 is formed on the oxidation layer 120 by chemical vapor deposition (CVD) and is made of amorphous silicon.

The laser beam 200 generated from the laser 10 is radiated onto the amorphous silicon thin film 130 and instantaneously melts a portion of the amorphous silicon thin film 130. The molten portion of the amorphous silicon thin film 130 rapidly undergoes solid-phase crystallization to thereby form the polycrystalline silicon thin film 140 made of polycrystalline silicon (p-Si).

Figure 4A:
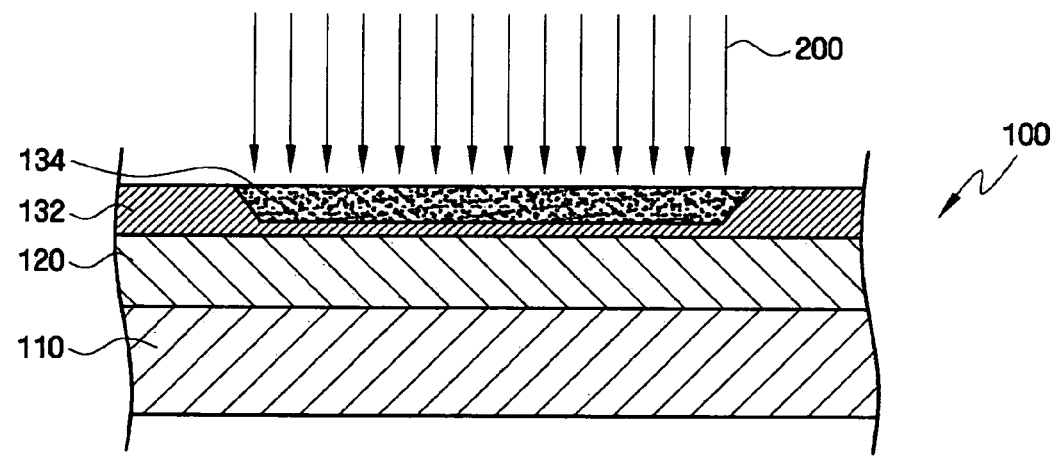
FIGS. 4A through 4F are sectional views illustrating a process of growing a polycrystalline silicon thin film by the method shown in FIG. 2.
Figure 4B:
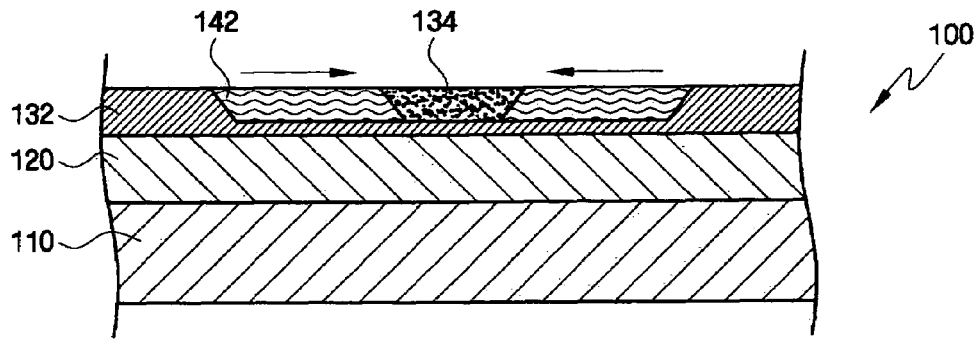
Figure 4C:
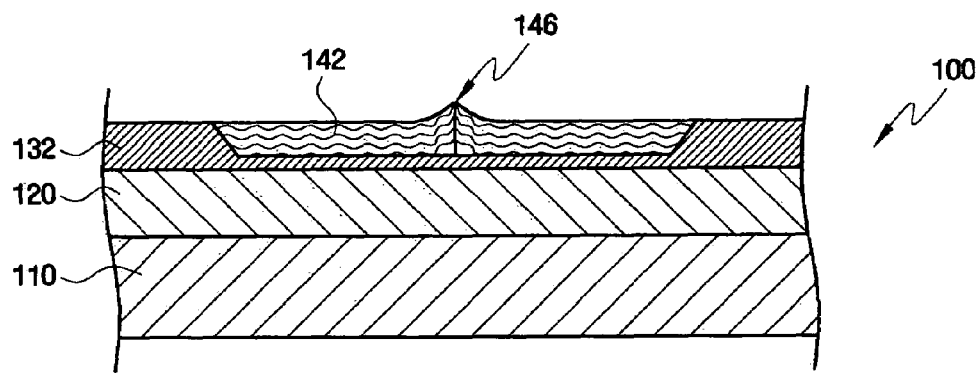
Figure 4D:
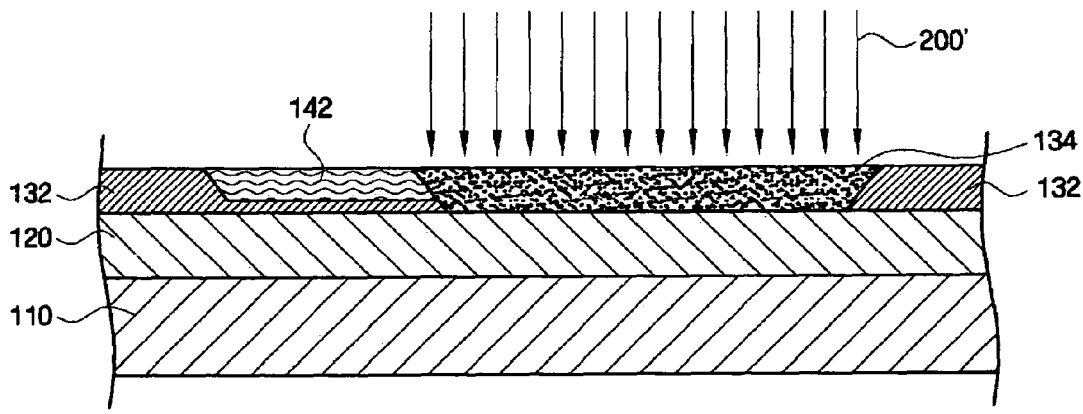
Figure 4E:
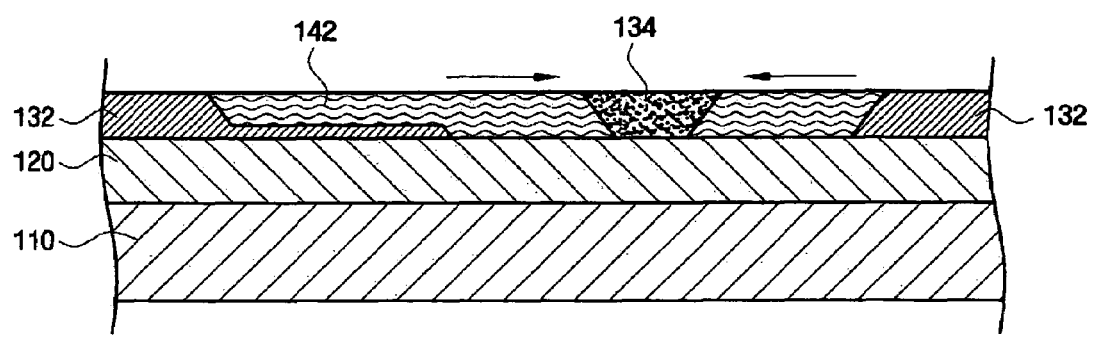
Figure 4F:
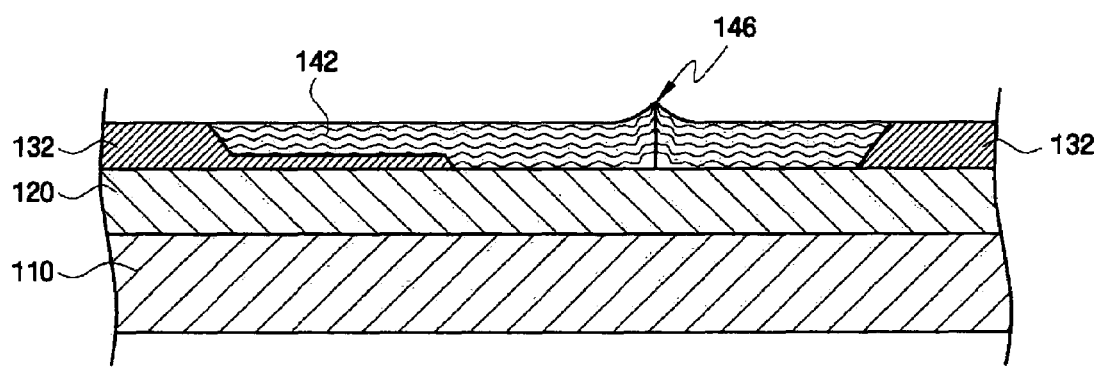

FIGS. 4A through 4F are sectional views illustrating a process of growing a polycrystalline silicon thin film by the method shown in FIG. 2. More specifically, FIG. 4A illustrates the partial melting of an amorphous silicon thin film by initial laser beam radiation. FIG. 4B illustrates the lateral growth of polycrystalline silicon, FIG. 4C illustrates the formation of a protruding portion 146 at the middle of the lateral growth length of the polycrystalline silicon, FIG. 4D illustrates the melting of the protruding portion 146 by laser beam irradiation, FIG. 4E illustrates the lateral growth of polycrystalline silicon, and FIG. 4F illustrates the formation of a protruding portion 146 at the middle of the lateral growth length of the polycrystalline silicon.

Referring to FIGS. 1 and 4A, first, a substrate 100 having thereon an amorphous silicon thin film 132 and a laser 10 generating a laser beam 200 are prepared. The substrate 100 is disposed on an XY-stage 20, and the laser beam 200 has a narrow width and a long length. Preferably, a length of the laser beam 200 is substantially the same as the length of a side of the substrate 100, and a width of the laser beam 200 is twice the lateral growth length of silicon grains. For example, the width of the laser beam 200 may range from 2 to 20 µm, and more preferably, from 4 to 8 µm.

Next, the laser beam 200 generated from the laser 10 is irradiated onto a portion of the amorphous silicon thin film 132 formed on a first end of the substrate 100. The portion of the amorphous silicon thin film 132 treated with the laser beam 200 is phase-transformed into liquid-phase silicon 134 by melting, whereas the other portion of the amorphous silicon thin film 132 untreated with the laser beam 200 is maintained as solid-phase amorphous silicon without being melted.

Here, amorphous silicon of the amorphous silicon thin film 132 is not completely melted with the laser beam 200 due to its insufficient energy density, and thus, the solid-phase amorphous silicon and the liquid-phase silicon coexist. The region at which the solid-phase amorphous silicon and the liquid-phase silicon coexist is designated "partial melting region."

Here, the laser beam 200 has a low energy density, i.e., about 300-500 $mJ/cm^2$, and preferably about 400 $mJ/cm^2$. In addition, the laser beam 200 is a pulsed excimer, and has a width in a range from 20 ns to 300 ns, preferably about 240 ns. The laser beam 200 has a frequency in a range from 300 Hz to 6000 Hz, preferably 4000 Hz to 6000 Hz.

Amorphous silicon can be partially melted even by only a single pulse of the laser beam 200. However, to improve crystallinity by reducing the defects of crystallized silicon grains and to achieve a poly-Si thin film predominantly in the {100} crystalline plane orientation, the amorphous silicon thin film 132 is continuously irradiated with 80 or more pulses of the laser beam 200. A detailed description thereof will be provided later.

Referring to FIG. 4B, the liquid-phase silicon 134 is crystallized laterally from both sides of the liquid-phase silicon 134 to the middle portion to thereby form polycrystalline silicon 142. Here, the solid-phase amorphous silicon thin film 132 serves as silicon grain nuclei for growing the polycrystalline silicon 142. That is to say, since the solid phase a-Si thin film 132 serves as a nucleus for growth of grains of poly-Si thin film 142, the poly-Si thin film 142 grows laterally from either side thereof by half a width of the laser beam 200. Here, the poly-Si thin film 142 grows laterally as long as 1 μm to 10 μm, typically 2 μm to 4 μm.

Figure 5:
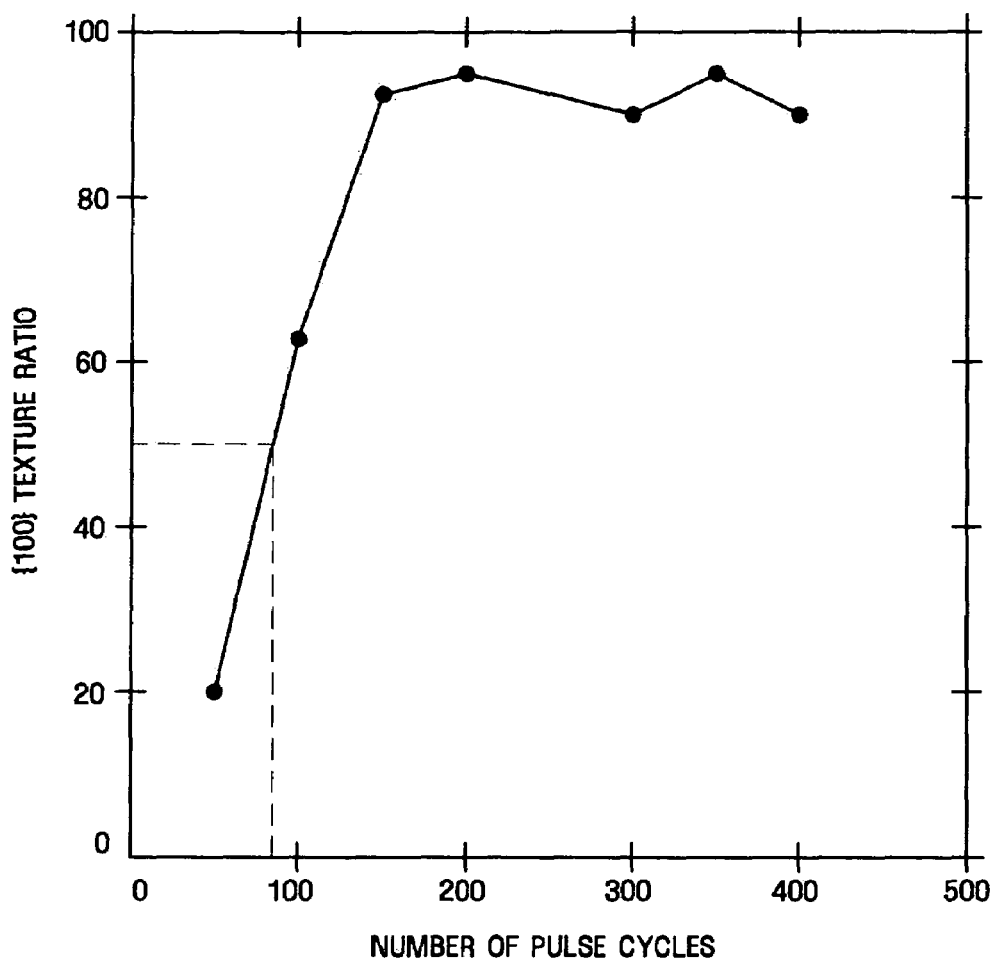
FIG. 5 is a graph illustrating the {100} texture ratio of polycrystalline silicon grains crystallized from partially molten silicon with respect to the number of pulse cycles of laser beam irradiated onto amorphous silicon.

The texture characteristics of the polycrystalline silicon 142 will be appreciated by reference to FIG. 5. FIG. 5 is a graph illustrating the {100} texture ratio of polycrystalline silicon grains crystallized from partially molten silicon with respect to the number of pulse cycles of laser beam irradiated onto amorphous silicon. As shown in FIG. 5, as the number of pulse cycles of laser beam increases, the {100} texture ratio increases. That is, as the number of pulse cycles of the laser beam 200 for forming the liquid-phase silicon 134 as shown in FIGS. 4A and 4B increases, the {100} texture ratio of silicon grains constituting the polycrystalline silicon 142 increases. This is because when silicon grains have {100} crystalline plane, the interface energy between the polycrystalline silicon 142 and the underlying oxide layer 120 decreases, which gives predominantly {100} texture at the partial melting region.

To improve the electrical mobility of silicon grains, it is preferable that the {100} texture ratio be about 50% or more. Thus, it is preferable that the amorphous silicon thin film 132 be irradiated with about 80 or more pulses of the laser beam 200. When the amorphous silicon thin film 132 is radiated with about 150 or more pulses of the laser beam 200, about 90% or more of crystallized grains have {100} texture.

Generally, it is known that the {110} or {111} crystalline plane of a polycrystalline silicon thin film exhibits electrical mobility of about 300-400 $cm^2V \cdot s$, whereas the {100} crystalline plane exhibits electrical mobility of about 600 $cm^2V \cdot s$. In this regard, in the present invention, the polycrystalline silicon 142 with major {100} texture can be obtained by repeated irradiation of the laser beam 200 with a relatively low energy density. Therefore, electrical mobility can be enhanced, which makes it possible to manufacture a polycrystalline silicon thin film transistor with improved electrical characteristics.

Referring to FIG. 4C, a protruding portion 146 is formed to a predetermined height at the middle of the lateral growth length of the polycrystalline silicon 142. The protruding portion 146 is caused when the lateral growth extending from both sides of the liquid-phase silicon 134 meets at the middle portion, and reduces the electrical mobility of the polycrystalline silicon 142. In this respect, it is preferable to remove the protruding portion 146 in a silicon thin film requiring high electrical mobility.

Referring to FIG. 4D, the substrate 100 is irradiated with a laser beam 200' with high energy density after it is moved by a predetermined distance from a first end (see 102 of FIG. 2) to a second end (see 104 of FIG. 2), to melt and remove the protruding portion 146. That is, when the substrate 100 is irradiated with the laser beam 200', the protruding portion 146, a portion of the polycrystalline silicon 142, and a portion of the amorphous silicon thin film 132 are completely melted to form liquid-phase silicon 134 again. Preferably, the substrate 100 is moved by such a distance so that the protruding portion 146 can be completely melted.

That is to say, a movement distance of the laser beam 200' may be smaller than a lateral growth length of liquid phase silicon 134, preferably less than half a width of the laser beam 200, more preferably in a range from 1 μm to 10 μm.

The laser beam 200 has a high energy density, and thus, can completely melt the portions of the polycrystalline silicon 142 and the amorphous silicon thin film 132 treated with the laser beam 200'. The region at which the polycrystalline silicon 142 and the amorphous silicon thin film 132 are completely melted is designated "complete melting region." The laser beam 200 of FIG. 4A and the laser beam 200' of FIG. 4D are substantially the same except energy density. That is, the laser beam 200' has a high energy density, i.e., about 600-900 $mJ/cm^2$, and preferably, about 800 $mJ/cm^2$. The laser beam 200' can completely melt the amorphous silicon thin film 132 even by only a single pulse. In some cases, several pulse irradiation of the laser beam 200' may also be required.

Referring to FIG. 4E, the liquid-phase silicon 134 of FIG. 4D crystallizes laterally from both sides of the liquid-phase silicon 134 to the middle portion. During this second solid-phase crystallization, the polycrystalline silicon 142 disposed at the left of the liquid-phase silicon 134 absorbs the liquid-phase silicon 134 and extends toward the right side, whereas the amorphous silicon thin film 132 disposed at the right of the liquid-phase silicon 134 grows toward the left side to an extent that is half a width of the laser beam 200. At this time, a left portion of polycrystalline silicon 142 formed by the second solid-phase crystallization is grown from grain nuclei formed by the first solid-phase crystallization, which predominantly grows {100} texture grains. Therefore, during subsequent continuing solid-phase crystallization, the polycrystalline silicon 142 consists mainly of {100} texture grains.

Referring to FIG. 4F, a protruding portion 146 is again formed to a predetermined height at the middle of the lateral growth length of the polycrystalline silicon 142. When the protruding portion 146 is again formed, the substrate 100 is moved by a predetermined distance to melt the protruding portion 146 by the laser beam 200. Liquid-phase silicon (not shown) obtained by the melting of the protruding portion 146 again undergoes lateral crystallization. The repeated cycles of the above-described melting and lateral growth result in a polycrystalline silicon thin film with higher electrical mobility.

Figure 6A:
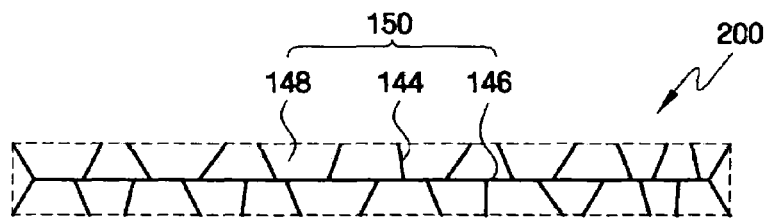
FIGS. 6A through 6D are schematic plan views illustrating a process of growing a polycrystalline silicon thin film in a method of forming a polycrystalline silicon thin film according to an embodiment of the present invention.
Figure 6B:
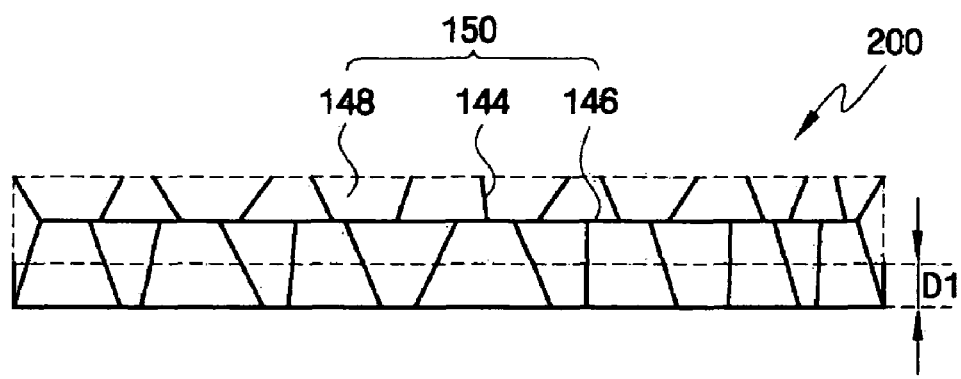
Figure 6C:
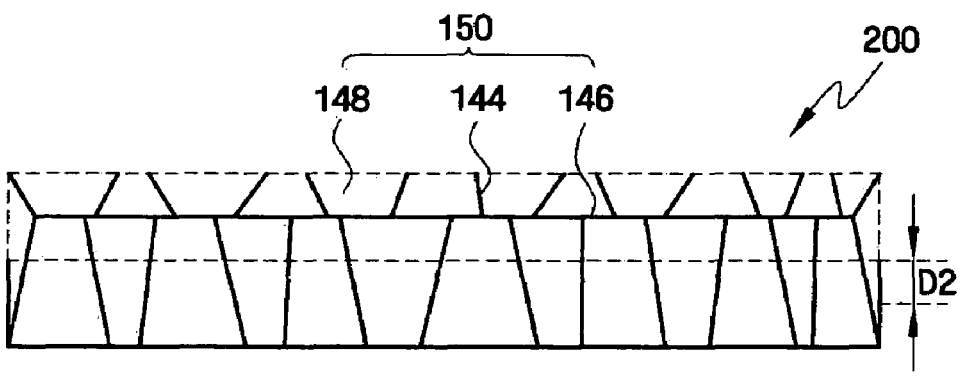
Figure 6D:
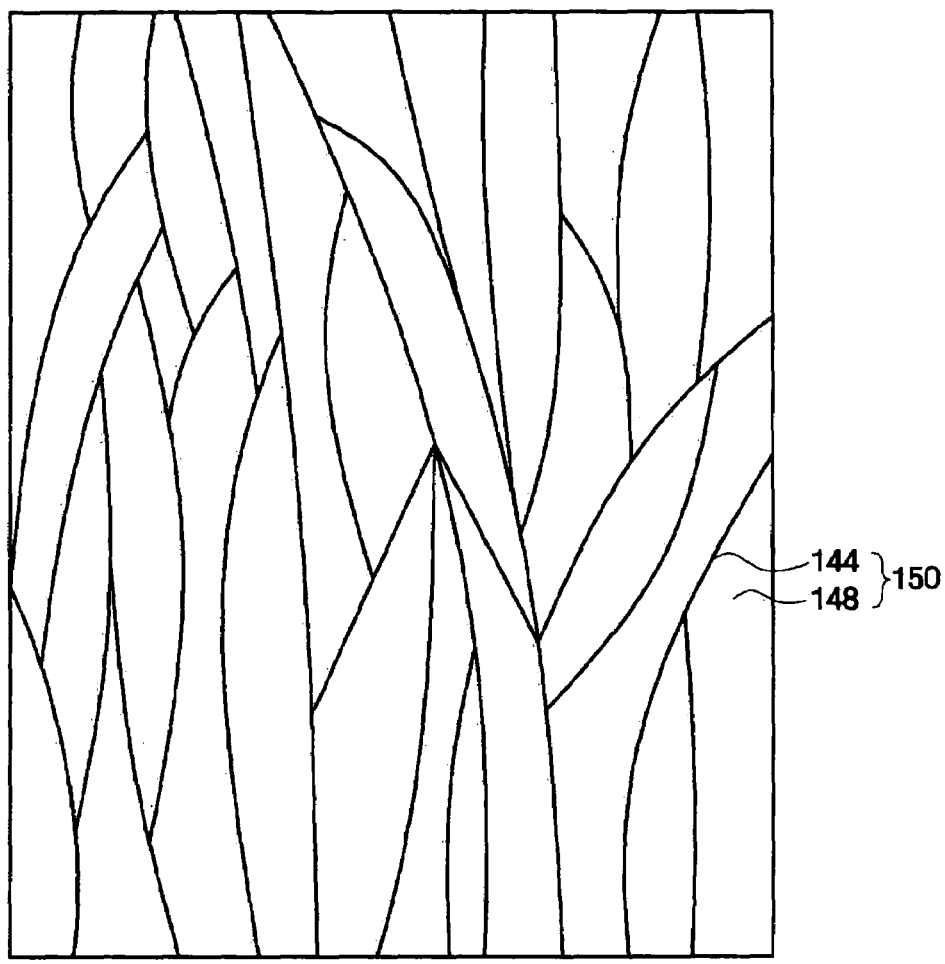

FIGS. 6A through 6D are schematic plan views illustrating a process of growing a polycrystalline silicon thin film in a method of forming a polycrystalline silicon thin film according to an embodiment of the present invention. More specifically, FIG. 6A is a plan view of a poly-Si thin film with first laser beam irradiation. FIG. 6B is a plan view of a poly-Si thin film with second laser beam irradiation, FIG. 6C is a plan view of a poly-Si thin film with third laser beam irradiation, and FIG. 6D is a plan view of a poly-Si thin film resulting after crystallization is completed with laser beams irradiated several times.

Referring to FIG. 6A, first irradiation of a laser beam 200 with low energy density is applied to a portion of an amorphous silicon thin film. The portion of the amorphous silicon thin film affected by the laser beam 200 is partially melted to be transformed into liquid-phase silicon. The liquid-phase silicon is solid-phase crystallized by lateral growth from the solid-phase amorphous silicon thin film at both sides of the liquid-phase silicon to thereby form polycrystalline silicon 150. During the lateral growth of the polycrystalline silicon 150, the solid-phase amorphous silicon thin film at both sides of the liquid-phase silicon serves as nuclei for growing a plurality of silicon grains 148 of the polycrystalline silicon 150. The silicon grains 148 grow and meet to form silicon grain boundaries 144 among the silicon grains 148.

In addition, as a result of lateral growth of the silicon grains 148, a protruding portion 146 is formed to a predetermined height at the middle of the lateral growth length. The protruding portion 146 is formed in almost a straight line along the middle portion of the lateral growth length corresponding to half a width of the laser beam 200.

Referring to FIG. 6B, after a substrate (not shown) is moved by a predetermined distance, a portion of the polycrystalline silicon 150 and a portion of the amorphous silicon thin film are again irradiated with the laser beam 200, this time however with high energy density. At this time, it is preferable that a first movement distance D1 of the substrate be equal to or less than half a short-axis direction width of the laser beam 200 to melt and remove the protruding portion 146. For example, the first movement distance D1 of the substrate is in a range from 1 to 10 µm.

In addition, if the amorphous silicon thin film is excessively irradiated with the laser beam 200, it may be peeled off by the laser beam 200. To prevent the peeling-off of the amorphous silicon thin film, it is preferable that an overlapping area between two adjacent laser-irradiated regions be 90% or less of the total area of the two laser-irradiated regions.

The second irradiation of the laser beam 200 melts the protruding portion 146, a portion of the polycrystalline silicon 150, and a portion of the amorphous silicon thin film, to thereby form liquid-phase silicon again. The polycrystalline silicon 150 formed by the first irradiation of the laser beam 200 is disposed at a side of the liquid-phase silicon and the existing solid-phase amorphous silicon thin film is disposed at the other side of the liquid-phase silicon.

At this time, the silicon grains 148 of the polycrystalline silicon 150 absorb the liquid-phase silicon and extend in one direction, whereas the solid-phase amorphous silicon thin film absorbs the liquid-phase silicon and grows new silicon grains 148 in the other direction. As a result of the lateral growth of the silicon grains 148, a new protruding portion 146 is formed to a predetermined height at the middle of the lateral growth length.

Referring to FIG. 6C, after the substrate is again moved by a predetermined distance, third irradiation of the laser beam 200 with high energy density is applied to a portion of the polycrystalline silicon 150 and a portion of the amorphous silicon thin film. At this time, it is preferable that the second movement distance D2 of the substrate be equal to the first movement distance D1 of the substrate, i.e., that the second movement distance D2 of the substrate be equal to or less than half a short-axis direction width of the laser beam 200 to melt and remove the newly formed protruding portion 146.

The portion of the polycrystalline silicon 150 and the portion of the amorphous silicon thin film affected by the third irradiation of the laser beam 200 are melted to form liquid-phase silicon again. At this time, the silicon grains 148 of the polycrystalline silicon 150 at a side of the liquid-phase silicon absorb the liquid-phase silicon and extend farther in one direction, whereas the solid-phase amorphous silicon thin film at the other side of the liquid-phase silicon absorbs the liquid-phase silicon and grows new silicon grains 148 in the other direction. As a result of the lateral growth of the silicon grains 148, a protruding portion 146 is again formed to a predetermined height at the middle of the lateral growth length.

As described above, the silicon grains 148 grow laterally by the repeated creation and removal of the protruding portion 146, thereby forming polycrystalline silicon 150 with higher electrical mobility as shown in FIG. 6D.

The polycrystalline silicon 150 thus completed is composed of a plurality of silicon grains 148 and a plurality of silicon grain boundaries 144. The silicon grains 148 grow parallel to each other. The silicon grain boundaries 144 also grow parallel to each other accordingly. Therefore, the polycrystalline silicon 150 exhibits high electrical mobility from one side to the other side.

According to the above-described embodiment, since an amorphous silicon thin film is repeatedly irradiated with a laser beam with the movement of a substrate by a predetermined distance, a polycrystalline silicon thin film including large-sized silicon grains can be formed.

Figure 7A:
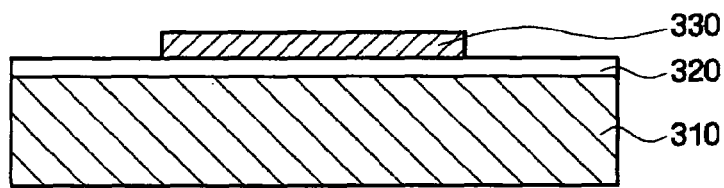
FIGS. 7A through 7D are sequential sectional views illustrating a method of manufacturing a thin film transistor according to an embodiment of the present invention.
Figure 7B:
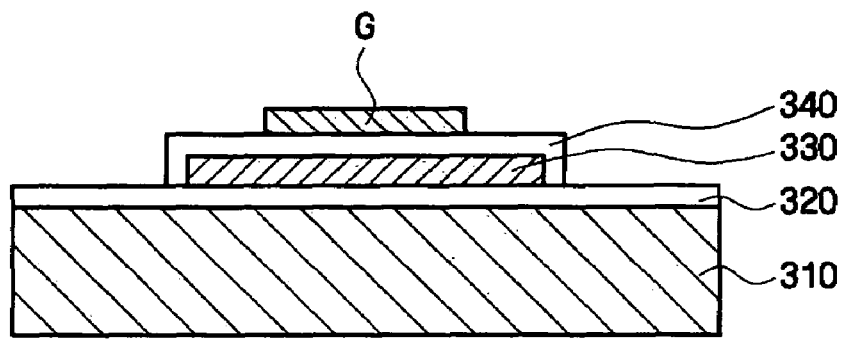
Figure 7C:
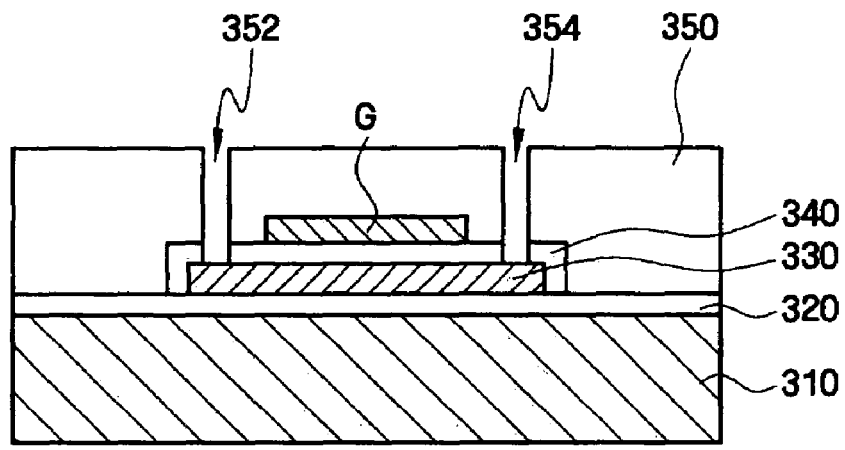
Figure 7D:
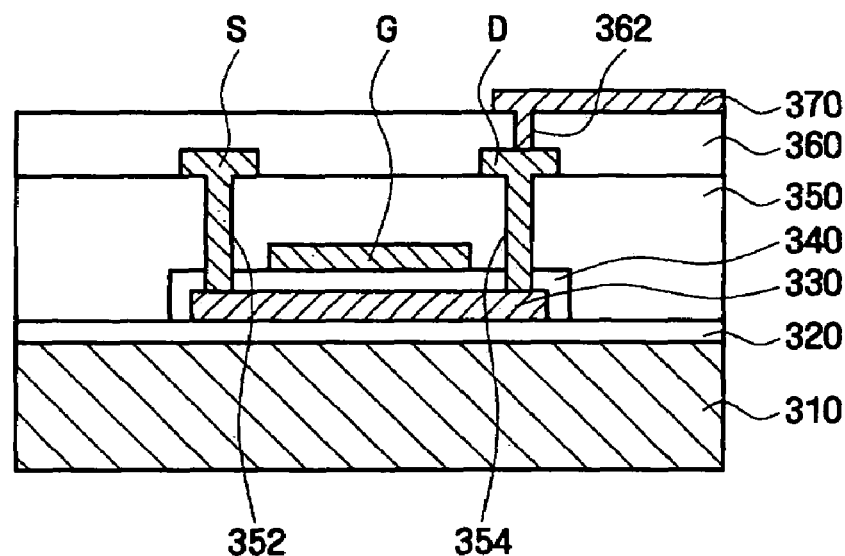

Hereinafter, a method of manufacturing a thin film transistor using the method of forming the polycrystalline silicon thin film illustrated with reference to FIGS. 1 through 6D will be described with reference to FIGS. 7A through 7D. FIGS. 7A through 7D are sequential sectional views illustrating a method of manufacturing a thin film transistor according to an embodiment of the present invention. In detail, FIG. 7A illustrates that a poly-Si pattern is formed on a substrate, FIG. 7B illustrates that an insulation layer and a drain electrode are formed on the poly-Si pattern, FIG. 7C illustrates that an insulation layer and a contact hole are formed on the drain electrode, and FIG. 7D illustrates that the source and drain electrodes are formed through contact holes. For brevity, the description of the method of forming the polycrystalline silicon thin film will be omitted.

Referring to FIG. 7A, an oxide layer 320 is formed on a transparent substrate 310, and an amorphous silicon thin film (not shown) is formed on the oxide layer 320. Then, the amorphous silicon thin film is phase-transformed into a polycrystalline silicon thin film (not shown) by laser beam irradiation. The polycrystalline silicon film may be formed using the above-described method. The polycrystalline silicon thin film is patterned to form a polycrystalline silicon pattern 330.

Referring to FIG. 7B, the polycrystalline silicon pattern 330 is covered with an insulating film 340 to protect the polycrystalline silicon pattern 330. The insulation layer 340 may be formed by, for example, PECVD (Plasma Enhanced Chemical Vapor Deposition).

Then, a gate electrode G is formed on the insulating film 340. Preferably, the gate electrode G is disposed on the middle portion of the polycrystalline silicon pattern 330. For example, the gate electrode G may be formed by depositing a metal material on the insulating film 340 and etching the deposited metal film.

Referring to FIG. 7C, an insulating layer 350 is formed to cover the gate electrode G and the insulating film 340. The insulation layer 350 may be formed by, for example, PECVD, and preferably has a thickness of not less than a predetermined level in order to ensure better reliability of the TFT and to prevent crosstalk. For example, the insulation layer 350 may have a thickness of 6000 Å or greater.

Then, a portion of the insulating film 340 and a portion of the insulating layer 350 are etched to form contact holes. The contact holes include a first contact hole 352 spaced apart from a side of the gate electrode G by a predetermined distance to expose a portion of the polycrystalline silicon pattern 330 and a second contact hole 354 spaced apart from the other side of the gate electrode G by a predetermined distance to expose a portion of the polycrystalline silicon pattern 330.

Referring to FIG. 7D, there are formed a source electrode S and a drain electrode D electrically connected to the polycrystalline silicon pattern 330 via the first contact hole 352 and the second contact hole 354, respectively. Here, the source electrode S is electrically connected with the poly-Si pattern 340 through the first contact hole 352 while the drain electrode D is electrically connected with the poly-Si pattern 340 through the second contact hole 354.

Then, a protection layer 360 covering the source electrode S and the drain electrode D is formed on the insulating layer 350 to protect the source electrode S and the drain electrode D. A portion of insulating layer 350 is then etched to form a pixel contact hole 362. A transparent pixel electrode 370 is formed on the protection layer 360 in such a way to be electrically connected to the drain electrode D via the pixel contact hole 362.

According to this embodiment, the polycrystalline silicon pattern 330 formed by laser beam irradiation exhibits high electrical mobility, which makes it possible to manufacture a thin film transistor with improved electrical characteristics.

The embodiment shown in FIGS. 7A through 7D illustrates a top gate mode thin film transistor, but the present invention is not limited thereto. The present invention can also be applied to a bottom gate mode thin film transistor.

As described above, in a method of forming a polycrystalline silicon thin film with improved electrical characteristics and a method of manufacturing a thin film transistor using the method of forming the polycrystalline silicon thin film of the present invention according to the present invention, {100} texture grains are predominantly formed by first irradiation of a laser beam with a low energy density, and grow by subsequent irradiation of a laser beam with a high energy density to thereby form silicon grains with major {100} texture and larger grain size. Therefore, a polycrystalline silicon thin film with improved electrical characteristics, e.g., improved electrical mobility, and a thin film transistor including the same can be formed.

Those skilled in the art will appreciate that many variations and modifications can be made to the preferred embodiments without substantially departing from the principles of the present invention. Therefore, the disclosed preferred embodiments of the invention are used in a generic and descriptive sense only and not for purposes of limitation.

What is claimed is:

1. A method of forming a polycrystalline silicon thin film, the method comprising:
   forming an amorphous silicon thin film on a substrate;
   partially melting in a region a portion of the amorphous silicon thin film by irradiating the region of the amorphous silicon thin film with a laser beam having a first energy density whereby polycrystalline silicon grains with a predetermined crystalline arrangement are formed in the region of partially molten amorphous silicon thin film;
   completely melting a portion of the polycrystalline silicon grains within the region and a portion of the amorphous silicon thin film adjacent to the region by irradiation of a laser beam having a second energy density greater than the first energy density.

2. The method of claim 1, wherein in the partially melting, the laser beam has an energy density of 300-500 mJ/cm$^2$.

3. The method of claim 2, wherein in the partially melting, the pulse width of the laser beam is from about 20-300 ns, and the portion of the amorphous silicon thin film is irradiated with 80 or more pulses of the laser beam.

4. The method of claim 1, wherein in the partially melting, the polycrystalline silicon grains have a {100} texture.

5. The method of claim 4, wherein the {100} texture ratio of the polycrystalline silicon grains is about 50% or more.

6. The method of claim 4, the partially melting is performed by 80 pulses of the laser beam or more.

7. The method of claim 1, wherein in the completely melting, the laser beam has an energy density of 600-900 mJ/cm$^2$.

8. The method of claim 5, wherein the completely melting is performed by only a single pulse of the laser beam.

9. The method of claim 1, wherein the polycrystalline silicon grains are formed by lateral growth.

10. The method of claim 9, wherein the polycrystalline silicon grains experience lateral growth in a range from 1 to 10 μm.

11. The method of claim 1, wherein the laser beam is rectangular and has a length greater than a width.

12. The method of claim 11, wherein the width of the laser beam is in a range from 2 to 20 μm.

13. The method of claim 11, wherein the substrate or the laser beam is moved in a width direction of the laser beam by not greater than half the width of the laser beam.

14. The method of claim 13, wherein the moving of the substrate or the laser in the width direction of the laser beam is in a range from 1 to 10 μm.

15. The method of claim 1, wherein an overlapping area between two adjacent laser-irradiated regions is 90% or less of the total area of the two laser-irradiated regions.

16. The method of claim 1, wherein the laser beam is generated from an excimer laser.

17. The method of claim 16, wherein the laser beam has a wavelength in a range from 200 to 400 nm.

18. The method of claim 16, wherein the laser beam has a frequency in a range from 300 to 6,000 Hz.

19. A method of manufacturing a thin film transistor, the method comprising:
   forming an amorphous silicon thin film on a substrate;
   forming a polycrystalline silicon thin film by irradiating the amorphous silicon thin film with a laser beam;
   forming a polycrystalline silicon pattern by patterning the polycrystalline silicon thin film;

forming an insulating film on the polycrystalline silicon pattern;

forming a gate electrode on the insulating film; and forming a source electrode and a drain electrode on portions of the polycrystalline silicon pattern separated from each other, and electrically connected to the portions of the polycrystalline silicon pattern, wherein the forming of the polycrystalline silicon thin film comprises:

forming an amorphous silicon thin film;

partially melting in a region a portion of the amorphous silicon thin film by irradiating the region of the amorphous silicon thin film with a laser beam having a first energy density whereby polycrystalline silicon grains with a predetermined crystalline arrangement are formed in the region of partially molten amorphous silicon thin film;

completely melting a portion of the polycrystalline silicon grains within the region and a portion of the amorphous silicon thin film adjacent to the region by irradiation of a laser beam having a second energy density greater than the first energy density.

20. The method of claim 19, wherein in the partially melting, the laser beam has an energy density of 300-500 mJ/cm$^2$.

21. The method of claim 20, wherein in the partially melting, the pulse width of the laser beam is from about 20-300 ns, and the portion of the amorphous silicon thin film is irradiated with 80 or more pulses of the laser beam.

22. The method of claim 19, wherein in the partially melting, the polycrystalline silicon grains have a {100} texture, and the {100} texture ratio of the polycrystalline silicon grains is about 50% or more.

23. The method of claim 19, wherein in the completely melting, the laser beam has an energy density of 600-900 mJ/cm$^2$.

24. The method of claim 23, wherein the completely melting is performed by only a single pulse of the laser beam.

* * * * *